United States Patent [19]
Choi et al.

[11] Patent Number: 5,926,704
[45] Date of Patent: Jul. 20, 1999

[54] EFFICIENT METHOD FOR FABRICATING P-WELLS AND N-WELLS

[75] Inventors: Jeong Y. Choi, Fremont; Chuen-Der Lien, Los Altos Hills, both of Calif.

[73] Assignee: Integrated Device Technology, Inc., Santa Clara, Calif.

[21] Appl. No.: 08/879,558

[22] Filed: Jun. 20, 1997

Related U.S. Application Data

[62] Division of application No. 08/539,801, Oct. 5, 1995, Pat. No. 5,679,588.

[51] Int. Cl.$^6$ ................................................ H01L 21/8238
[52] U.S. Cl. ........................... 438/227; 438/232; 438/298; 438/420; 438/526
[58] Field of Search .................................... 438/199, 227, 438/232, 298, 420, 526, 168, 205, 216, 217, 218

[56] References Cited

U.S. PATENT DOCUMENTS

| | | | |
|---|---|---|---|
| 4,412,375 | 11/1983 | Mathews | 437/57 |
| 4,728,619 | 3/1988 | Pfiester et al. | 437/34 |
| 5,141,882 | 8/1992 | Komori et al. | 437/45 |
| 5,256,563 | 10/1993 | Moslehi et al. | 437/56 |
| 5,384,279 | 1/1995 | Stolmeijer et al. | 437/45 |
| 5,427,964 | 6/1995 | Kaneshiro et al. | 438/57 |
| 5,679,588 | 10/1997 | Choi et al. | 437/34 |

FOREIGN PATENT DOCUMENTS

| | | | |
|---|---|---|---|
| 292829 | of 0000 | Japan | 438/205 |
| 0107066 | 7/1982 | Japan . | |
| 0143854 | 9/1982 | Japan . | |
| 0031553 | 2/1983 | Japan . | |
| 0150467 | 8/1984 | Japan . | |
| 0210659 | 11/1984 | Japan . | |
| 8302197 | 6/1983 | WIPO . | |

*Primary Examiner*—Peter Toby Brown
*Assistant Examiner*—Long Pham
*Attorney, Agent, or Firm*—Skjerven, Morrill, MacPherson, Franklin & Friel

[57] ABSTRACT

A method forms, in a CMOS semiconductor substrate, P- and N-wells having independently optimized field regions and active regions. In one embodiment, P- and N-wells are formed by (i) creating in successive steps the field regions of the P- and N-wells; (ii) creating an oxide layer over the field regions, (iii) creating in successive steps the active regions. The method achieves the P- and N-wells without increasing the number of photoresist masking steps. In addition, optical alignment targets (OATs) are optionally formed simultaneously with these P- and N-wells without increasing the total number of process steps.

8 Claims, 9 Drawing Sheets

EFFICIENT METHOD FOR FABRICATING P-WELLS AND N-WELLS

This application is a division of application Ser. No. 08/539,801, filed Oct. 5, 1995, now U.S. Pat. No. 5,679,588.

FIELD OF THE INVENTION

This invention relates to processes which forms both P-wells and N-wells on a single semiconductor substrate.

BACKGROUND OF THE INVENTION

Processes for forming P-wells and N-wells on a single semiconductor substrate are well known in the art. Such P-wells and N-wells are formed to allow both N-channel and P-channel field effect transistors (FETs), respectively, to be fabricated on the same integrated circuits. In the prior art, several conventional processes have evolved, including the five process flows which are discussed next.

The first conventional process ("flow A1"), which is also known as the "blanket N-well" process, is illustrated in FIGS. 1a to 1d and described as follows:

(a) FIG. 1a shows that a thin oxide layer 111 is first formed over the entire surface of a P-type substrate 110, which is then patterned by a P-well photoresist mask 120 to allow a blanket P-type ion implantation step 130.

(b) FIG. 1b is a cross-sectional view of substrate 110 after P-well photoresist mask 120 is removed by a conventional step. FIG. 1b shows a blanket N-type ion implantation step 131, which implants N type ions through thin oxide layer 111 without using an additional photoresist masking step. Under this process, the N-type dopant is designed to have a sufficiently low concentration, so as not to counterdope the existing P-type region created by the P-type ion implantation step 130 in substrate 110 to become N-type.

(c) FIG. 1c shows a drive-in step to diffuse the implanted P-type and N-type species to form P-well 112 and N-well 113. Nitride structures 122a and 122b are then formed on oxide layer 111 to simultaneously define "island" or "active" regions of P-well 112 and N-well 113. A photoresist mask 121 is then disposed generally over N-well 113. A P-type anti-inversion ("channel-stop") implantation step 132 is then performed into P-well field regions 112a and 112b. Nitride structure 122a serves as an implantation mask for shielding P-island region 112c during the ion implantation step 132. In this process, the ion implantation steps occur prior to forming the LOCOS ("local oxidation of silicon") field oxide layer.

(d) FIG. 1d shows that photoresist mask 121 is removed, a LOCOS field oxide layer 114 is then formed, and nitride structures 122a and 122b are subsequently removed from the semiconductor surface.

A variation of flow A1, referred below as "flow A2", forms the P-wells and the N-wells, using a self-aligned N-well ion implantation step. This process, which is shown in FIGS. 2a–2d, is referred to as a "self-aligned N-well" process. The difference between flows A1 and A2 is the self-aligned N-well implantation step. Flow A2 includes the following steps:

(a) As shown in FIG. 2a, a thin oxide layer 211 is formed over the entire surface of substrate 210. A nitride layer 223 is then formed on top of thin oxide layer 211. The surface of nitride layer 223 is then patterned by a P-well photoresist mask 220 and a nitride etch. A P-type ion implantation step 230 defines a P-well region.

(b) Following the P-type ion implantation step 230, P-well photoresist mask 220 is removed and a LOCOS oxide layer 214 is formed, as shown in FIG. 2b. The remaining nitride layer 223 is then removed. An N-type blanket self-aligned implantation step 231 defines an N-well region, with LOCOS oxide layer 214 protecting the P-well region defined in the steps of FIG. 2a above.

(c) As shown in FIG. 2c, a drive-in step drives the implanted P-type and N-type species into substrate 210, thereby forming P-well 212 and N-well 213, respectively. LOCOS oxide layer 214 is then removed, and nitride structures 222a and 222b are formed over thin oxide layer 211 to define the island regions of P-well 212 and N-well 213, respectively. A photoresist mask 224 is then formed above N-well 213. An ion implantation step 232 then provides the channel-stop ion implantation into field regions 212a and 212b.

(d) Finally, as shown in FIG. 2d, photoresist mask 224 is removed, and a LOCOS field oxide layer 215 is formed. Nitride structures 222a and 222b are then removed.

A third conventional method, known as the "the blanket P-well process" and referred below as "flow B"), is shown in FIGS. 3a–3d. The process of flow B provides the P-well and the N-well structures in a manner similar to flow A1, except N-well ion implantation step 331 uses a photoresist mask 325 to define the N-well region. In flow A1, the corresponding step to N-well ion implantation step 331 is ion implantation step 130 (FIG. 1a), which defines the N-well region. Consequently, the subsequent P-type implantation step 330 is a blanket ion implantation step self-aligned to an N-well. Thus, the process steps in flow B are:

(a) FIG. 3a shows that a thin oxide layer 311 is first formed over the entire surface of a P-type substrate 310, which is then patterned by a N-well photoresist mask 325 to allow a blanket N-type ion implantation step 331.

(b) FIG. 3b is a cross-sectional view of substrate 310 after N-well photoresist mask 325 is removed by a conventional step. FIG. 3b shows a blanket P-type ion implantation step 330, which implants P-type ions through thin oxide layer 311 without using a photoresist masking step. Under this process, the P-type dopant is implanted to a sufficiently low concentration, so as not to counterdope the existing N-type regions created by N-type ion implantation step 331 in substrate 310 to become P-type.

(c) FIG. 3c shows a drive-in step to drive the implanted P-type and N-type species to form P-well 312 and N-well 313. Nitride structures 322a and 322b are then formed on thin oxide layer 311 to simultaneously define island regions of P-well 312 and N-well 313. A photoresist mask 321 is provided above N-well 313. A P-type channel stop implantation step 332 introduces P-type species into P-well field regions 312a and 312b. Nitride structure 322a serves as an implantation mask for shielding P-island region 312c during the ion implantation step 332. In this process, the ion implantation steps occur prior to forming the LOCOS ("local oxidation of silicon") field oxide layer.

(d) FIG. 3d shows that photoresist mask 321 is removed, a LOCOS field oxide layer 314 is then formed, and nitride structures 322a and 322b are removed from the semiconductor surface.

A fourth method, known as "the retrograded P-well process" and referred below as "flow C", is similar to flow B, except that, after the LOCOS field oxide layer is formed, an implantation masking step is used to adjust P-well doping levels for the active regions and the field regions. Flow C, which combines P-well and field implantation steps, is described as follows in conjunction with FIGS. 4a–4d:

(a) FIG. 4a shows a thin oxide layer 411 formed over the entire surface of substrate 410. An N-well photoresist mask 425 is then patterned over oxide layer 411, and an N-type ion implantation step 431 defines an N-well region.

(b) As shown in FIG. 4b, photoresist mask 425 is removed after the N-type ion implantation step 431. A drive-in step drives the implant N-type species into substrate 410 to form N-well 413. Nitride structures 422a and 422b are then formed over thin oxide layer 411 to define the P-type and N-type island regions, respectively.

(c) As shown in FIG. 4c, a LOCOS field oxide layer 414 is then formed. Nitride structures 422a and 422b are then removed, and a photoresist mask 421 is then provided over N-well 413. A P-type ion implantation step 432 and a subsequent drive-in step provide P-well 412. Dopant concentration in field regions 412a and 412b can be controlled by a channel stop ion implantation step, using an additional masking step (FIG. 4d).

In the processes described above, field regions of the N-well can also be formed using similar steps to those discussed above with respect to fields region of the P-well.

A fifth prior art method, which is referred below as "flow D", is shown in FIGS. 5a–5d. Flow D is similar to both flow A and flow B, except that the island regions in the P-wells and the N-wells are defined separately for N-channel and the P-channel transistors, so that the P-well field regions can be defined without an additional photoresist mask. Flow D is described as follows:

(a) As shown in FIG. 5a, a P-well 512 and an N-well 513 are formed using conventional photoresist masks, P-type and N-type ion implantation and subsequent drive-in steps. Thereafter, a thin oxide layer 511 is formed over the entire surface of substrate 510. A nitride layer 523 is then formed over thin oxide layer 511.

(b) As shown in FIG. 5b, N-well field regions 512a and 513b are then formed using a photoresist mask 525, a nitride etch (forming structures 523a and 523b), and an N-type ion implantation step 531 performed through the exposed regions of oxide layer 511.

(c) As shown in FIG. 5c, photoresist mask 525 is removed, and a photoresist mask 526 is then patterned over the semiconductor surface to protect N-well 513 and to define an island region for P-well 512. Nitride layer 523c is then formed by etching the exposed regions of nitride layer 523a. A P-type ion implantation step 532 defines P-well field regions 512a and 512b.

(d) Finally, as shown in FIG. 5d, photoresist mask 526 is then removed. LOCOS field oxide layer 514 is then formed. Nitride structures 523b and 523b are then removed.

All the above described prior art process flows share a significant disadvantage in that the formation of P-wells and N-wells is accomplished by one or two ion implantation steps followed by a subsequent lengthy thermal or drive-in step, thereby resulting in a costly and time-consuming process. For example, to provide a deep well profile necessary to prevent the "latch-up" phenomenon, e.g. a well depth of 2 microns, drive-in periods can exceed 24 hours. In addition, because entire well bodies, i.e., both field and island regions, are formed at the same time, island regions cannot be independently optimized for desirable device and isolation characteristics. The island regions in the P- and N-wells cannot be individually optimized because the optimum dopant concentration in the island regions are too low for adequate isolation. Field regions in the P- and N-wells, however, are doped three or four times the dopant concentrations in the island regions. The above-described conventional processes each also require an extra photoresist masking step for forming optical alignment targets (OATs), which are structures formed on the semiconductor surface to allow proper alignment between the various photoresist masking steps.

Accordingly, there is a need for an efficient method for fabricating P-wells and N-wells which optimizes transistor performance and creates OATs without increasing the number of photoresist masking steps.

SUMMARY OF THE INVENTION

In accordance with the present invention, a method is provided for fabricating on a semiconductor substrate a first well of a first conductivity and a second well of a second conductivity opposite said first conductivity. The method includes: (i) forming a first field region within a region of the semiconductor substrate designated for the first well; (ii) forming a second field region within a region of said semiconductor substrate designated for the second well; (iii) forming a protective mask layer above the first and second field regions; (iv) forming a first active region within the first well; and (v) forming a second active region within the second well. The steps in forming the active regions in the first and second wells provides the ability to adjust the dopant concentrations of these active regions independently from their respective field regions.

In one embodiment, the step for forming the first field region includes (a) forming an oxide layer over the entire surface of the semiconductor substrate; (b) forming a nitride layer over the oxide layer; (c) patterning the nitride layer using a first photoresist mask to expose portions of the nitride layer above the first field region; (d) removing the exposed portions of the nitride layer; and (e) implanting a dopant of the first conductivity type into the first field region.

In the processes under the present invention, the P-wells and the N-wells are formed by dopant diffusion in one or more thermal cycles incidental to process steps subsequent to their respective implanting steps.

In addition, the method for the present invention can also be used to form optical alignment targets without additional photomasking layers. In one embodiment, the optical alignment targets are formed by (i) removing, subsequent to the step of removing the exposed portions of the nitride layer, a portion of the semiconductor substrate underneath the exposed portions of the nitride layer to a predetermined depth, thereby exposing portions of the semiconductor substrate; and (ii) providing a layer of oxide over the exposed portions of the semiconductor substrate. In that embodiment, the layer of oxide is formed by a LOCOS process, to be followed by a controlled removal of the oxide down to a predetermined depth. Alternatively, the layer of oxide can be grown to a desired thickness.

The ability to separately form the field and active ("island") regions of N- and P-wells provides the advantages of: (1) a flexibility in determining well dopant profile; (2) an ease in optimizing FETs independently with respect to their field and active regions; and (3) a reduction of cycle time by eliminating time-consuming drive-in steps necessary in the prior art for forming the P-wells and N-wells. In addition, the present invention allows optical alignment targets (OATs) to be formed without an additional masking step.

The present invention is better understood upon consideration of the detailed description below and the accompanying drawings.

DETAILED DESCRIPTION OF THE INVENTION

FIGS. 6a–6e show, in accordance with the present invention, the process steps for separately fabricating field and active regions of the P-wells and N-wells. The present invention optimizes the P- and N-wells without requiring additional photoresist masking steps over conventional processes. The resulting P-wells and N-wells are each optimized in its field and island (i.e. active) regions independently.

In this description, as is known to those skilled in the art, phosphorus, arsenic and antimony can be used as N-type semiconductor impurities, or dopants, for creating regions of N-type conductivity. Likewise, boron can be used as a P-type dopant for creating regions of P-type conductivity. In the ion implantation steps described below, each of these elements is preferably implanted in its singly ionized form. Subsequent to the ion implantation step, various annealing steps can be used to repair the implant lattice damage, to activate the implanted species, and to drive the species to predetermined depths, according to the known characteristics of the species and its anneal parameters. Alternatively, certain steps for introducing impurities by ion implantation can be replaced by diffusion steps.

Well-known photoresist masking, etching and cleaning techniques are used in conjunction with the process of the present invention described herein. Thus, detailed descriptions of these well-known steps and other conventional semiconductor fabrication process steps are omitted from the present detailed description so as not to clutter the discussion. Similarly, listing of typical ingredients for these well-known steps are also omitted.

Figure 1A:
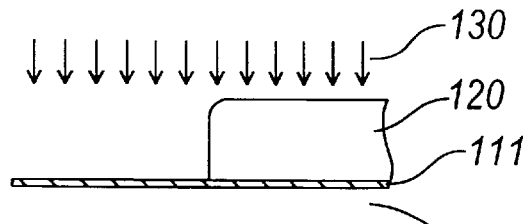
FIGS. 1a–1d are cross sectional views of a semiconductor substrate at various steps in a first conventional process.
Figure 1B:
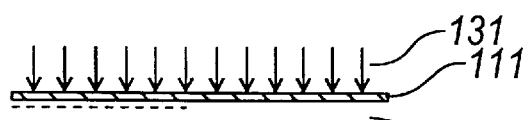
Figure 1C:
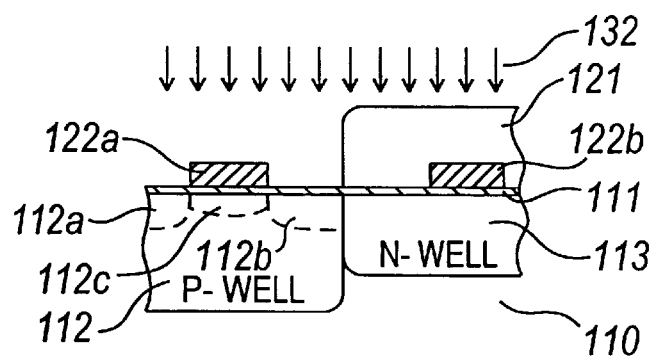
Figure 1D:
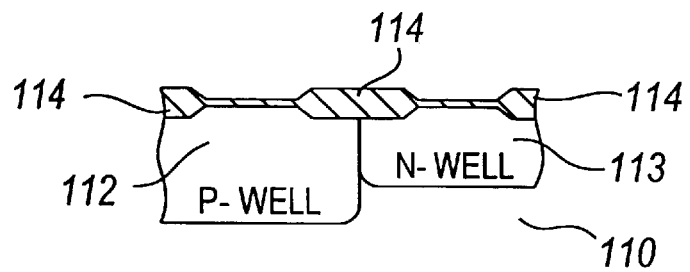
Figure 2A:
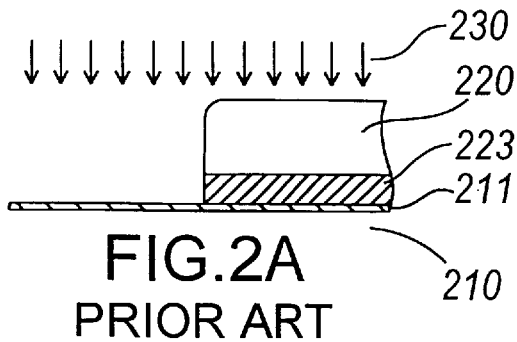
FIGS. 2a–2d are cross sectional views of a semiconductor substrate at various steps in a second conventional process.
Figure 2B:
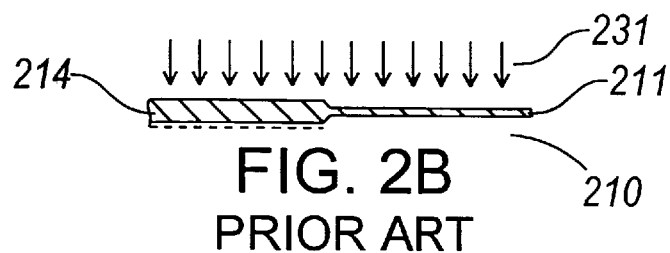
Figure 2C:
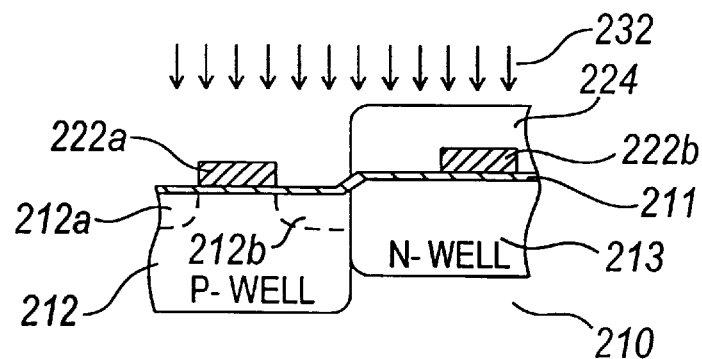
Figure 2D:
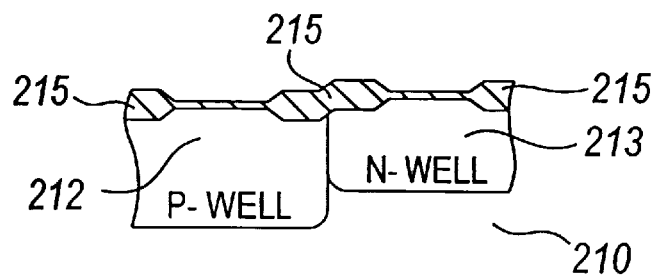
Figure 3A:
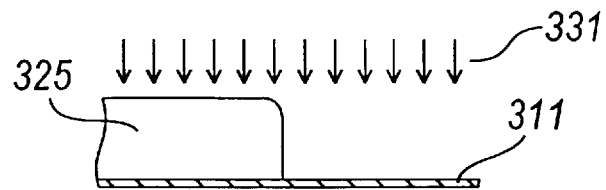
FIGS. 3a–3d are cross-sectional views of a semiconductor substrate at various steps in a third conventional process.
Figure 3B:
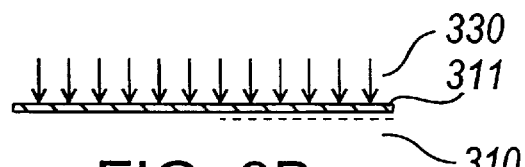
Figure 3C:
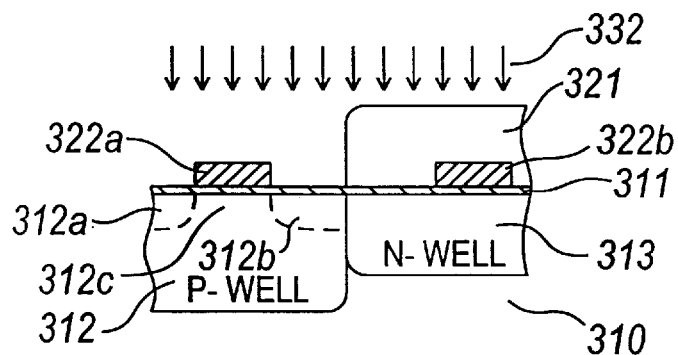
Figure 3D:
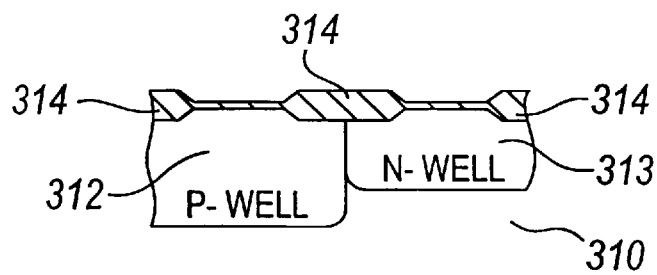
Figure 4A:
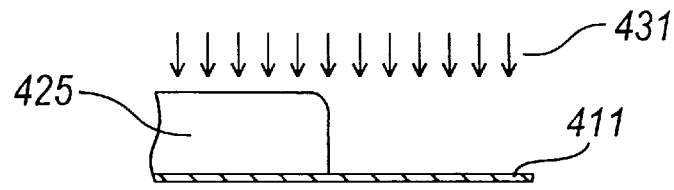
FIGS. 4a–4d are cross sectional views of a semiconductor substrate at various steps in a fourth conventional process.
Figure 4B:
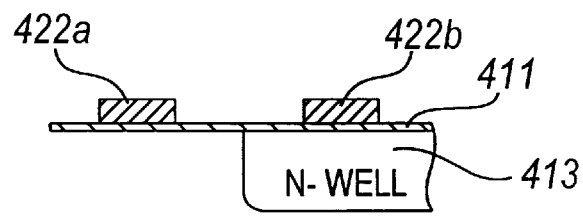
Figure 4C:
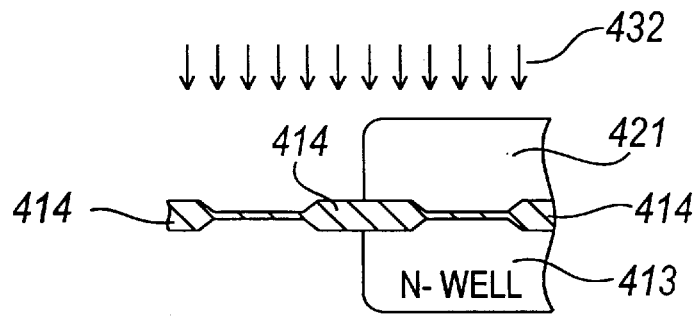
Figure 4D:
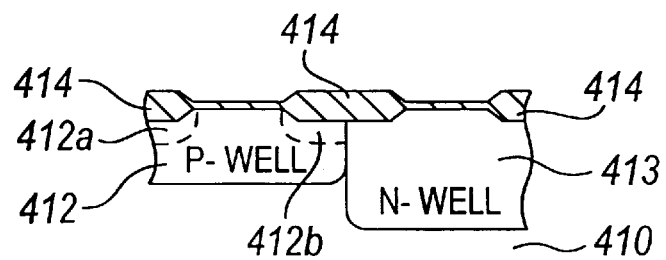
Figure 5A:
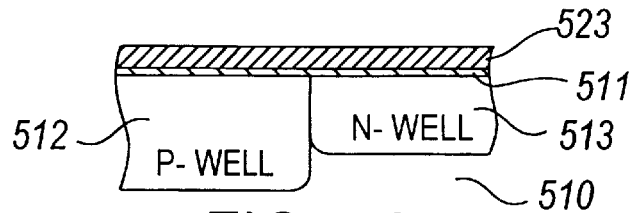
FIGS. 5a–5d are cross sectional views of a semiconductor substrate at various steps in a fifth conventional process.
Figure 5B:
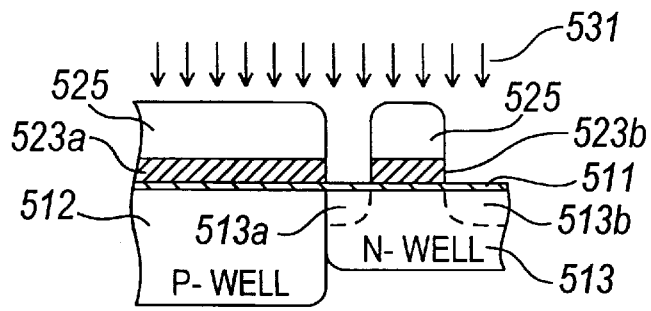
Figure 5C:
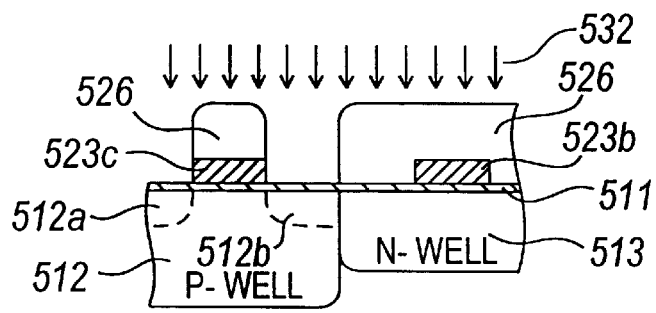
Figure 5D:
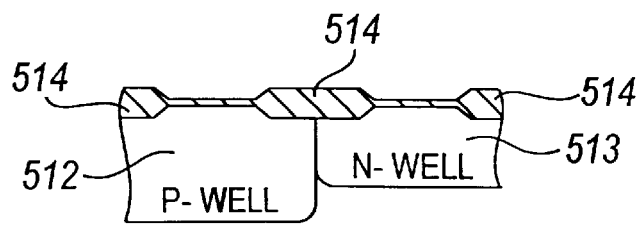
Figure 6A:
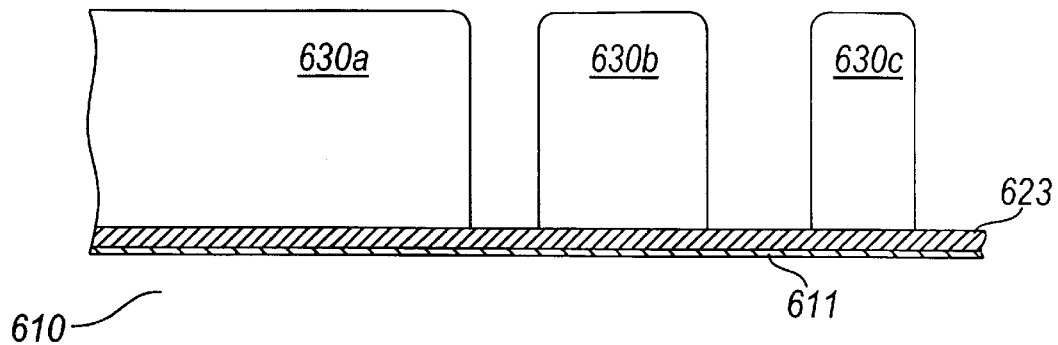
FIGS. 6a–6f are cross sectional views of a semiconductor substrate at various steps of a process of the present invention.

FIG. 6a is a cross-sectional view of an N-type silicon substrate 610, which is used as starting material. A thin oxide layer 611 about 200 Å thick is formed over substrate 610. On top of thin oxide layer 611 is then formed a 1500 Å thick nitride layer 623, using conventional process steps. Then, nitride 623 is patterned by a deposited photoresist mask 630, to provide protective photoresist structures (e.g. photoresist structures 630a, 630b and 603c), so as to define the field regions of a N-well (e.g. in FIG. 6b, between structures 630a and 630b and between structures 630b and 630c) and a self-aligned pattern for creating an optical alignment target (OAT) to the right of structure 630c.

Figure 6B:
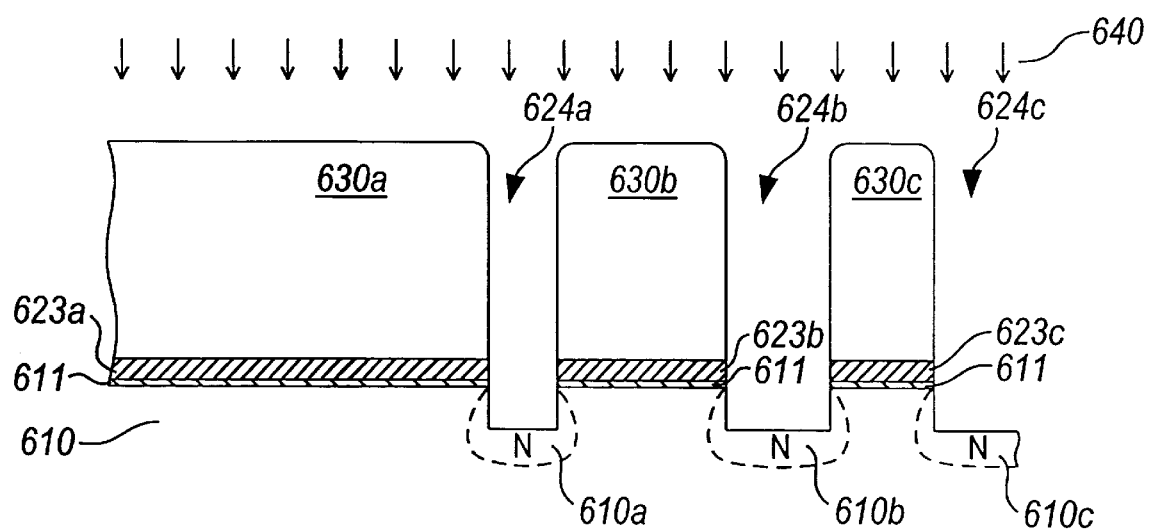
Figure 6C:
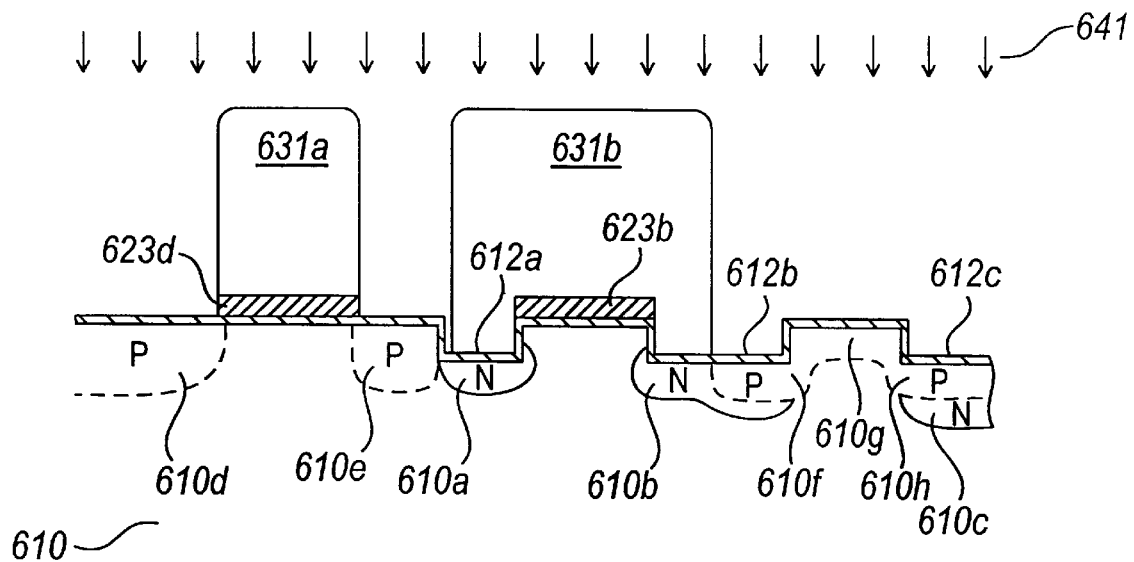

As shown in FIG. 6b, the exposed regions of nitride layer 623 is removed, forming nitride structures 623a, 623b and 623c, and exposing the regions in oxide layer 611 underneath the nitride regions removed. The exposed regions in oxide layer 611 and the portions of silicon substrate 610 underneath these exposed regions of oxide layer 611 are then removed. In particular, silicon substrate 610 is etched to a depth of about 1200 Å, so as to form corresponding recessed regions 624a, 624b and 624c in substrate 610. Thereafter, an N-type ion implantation step 640 creates N-type regions 610a, 610b, and 610c in substrate 610. N-type regions 610a and 610b are the field regions of an N-well.

Photoresist structures 630a, 630b, and 630c are then removed. The exposed semiconductor surfaces above the implanted regions 610a, 610b and 610c are then oxidized to provide 500 Å thick oxide structures 612a, 612b and 612c (FIG. 6c), respectively, each oxidized to an oxide layer of approximately 1200 Å thick. A second photoresist mask, represented in FIG. 6c by photoresist structures 631a and 631b, is then formed to expose field regions of a P-well, while protecting the entire N-well region underneath photoresist structure 631b, and an island region of the P-well underneath photoresist structure 631a. The portions of nitride layer 623a thus exposed are removed, leaving nitride structure 623d underneath photoresist structure 631a. P-type field regions 610d, and 610e are then formed by P-type ion implantation step 641. Note that substrate regions 610f, 610g and 610h in an OAT are also incidentally implanted by ion implantation step 641.

Figure 6D:
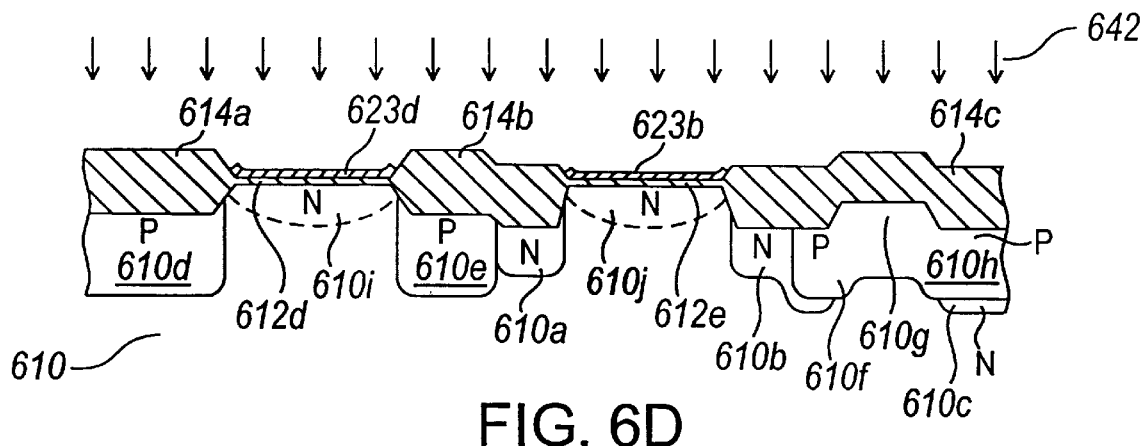

Photoresist structures 631a and 631b are then removed (FIG. 6d). LOCOS field oxide regions 614a, 614b, 614c are then formed using remaining nitride structures 623d and 623b as masks. A self-aligned N-type ion implantation step 642 through oxide regions 612d and 612e, creates N-type regions 610i and 610j, respectively. Self-aligned N-type ion implantation step 642 allows the dopant concentration in island region 610j to be adjusted independently of the field regions 610a and 610b. Subsequently, nitride structures 623d and 623b are removed.

Figure 6E:
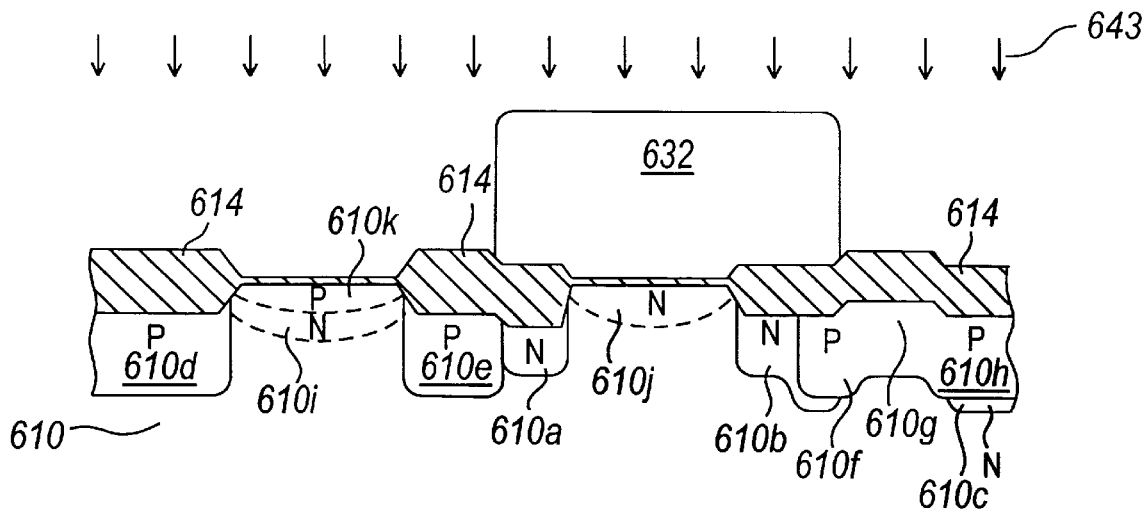
Figure 6F:
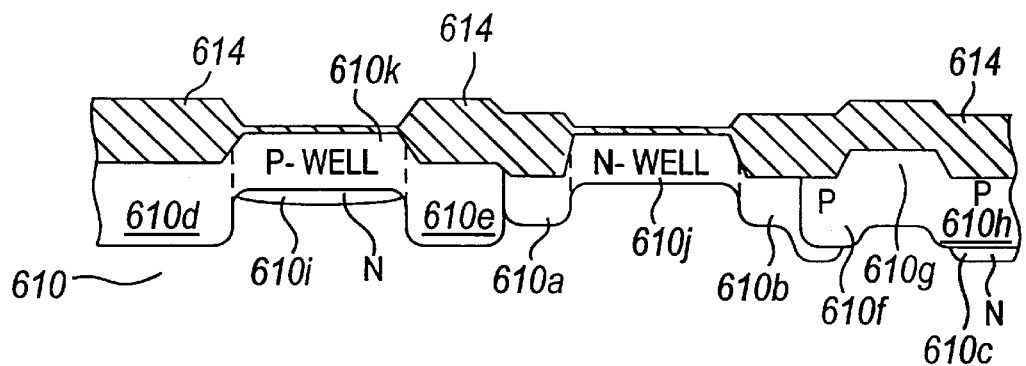

As shown in FIG. 6e, a third photoresist mask layer, represented by structure 632, is provided over N-well regions 610a, 610b and 610j. A P-type ion implantation step 643 creates an island region 610k. P-type ion implantation step 643 allows the dopant concentration in island region 610k to be adjusted independently of the field regions 610d and 610e. A P-well, formed by regions 610k, 610d and 610e, and an N-well, formed by regions 610j, 610a, and 610b, are formed incidentally in the subsequent thermal cycles of the remaining steps, e.g. the formation of P-channel and N-channel transistors, without a time-consuming drive-in step dedicated to form these N-wells and P-wells.

In another embodiment, the starting substrate is a P-type semiconductor wafer. Higher energy ion implantation steps (e.g. up to 1 MeV) are necessary to form a reasonably deep N-well in both the field regions (formed prior to field oxidation), and the island regions (formed after field oxidation), by counter-doping the P-type substrate. The process steps for this alternative embodiment follows substantially those shown in FIGS. 6a–6e.

As discussed above, the present invention forms optical alignment targets (OATs) without increasing the number of photoresist masking steps. As discussed above with respect to FIG. 6a, photoresist layer 630 includes an OAT extension portion 630c provided to define the OATs. The present invention can provide the OATs on substrate 610 using one of the following three procedures (the first of these three procedures is already described above in conjunction with FIGS. 6a–6f):

(a) As shown in FIG. 6b, substrate 610 is etched before the removal of photoresist mask 630. The depth to which substrate 610 is etched is determined by the OAT step height requirement. As discussed above, and shown in FIG. 6c, thin oxide regions 612b and 612c, about 500 Å thick, are formed after removing photoresist layer 630, but prior to providing photoresist layer 631. Thin oxide regions 612b and 612c protect their respective portions of the underlying substrate during the removal of nitride layer 623.

Figure 6G:
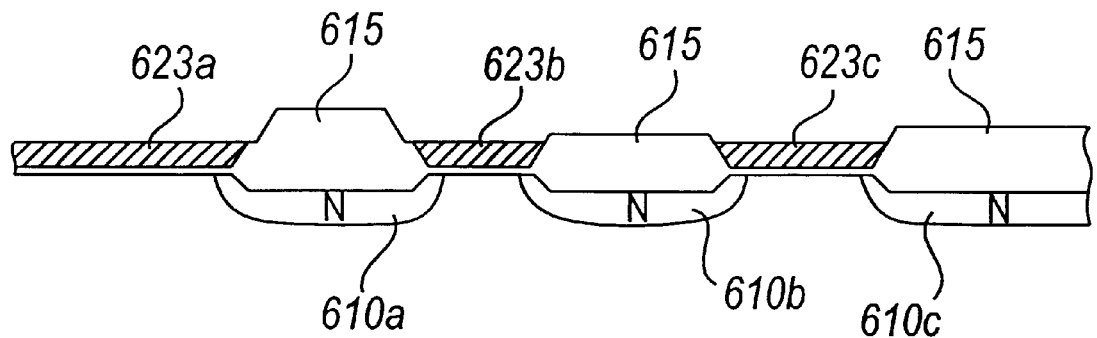
FIGS. 6g and 6h are cross sectional views of a semiconductor substrate for illustrating an alternative process for providing OATs without additional photomasking steps, in accordance with the present invention.
Figure 6H:
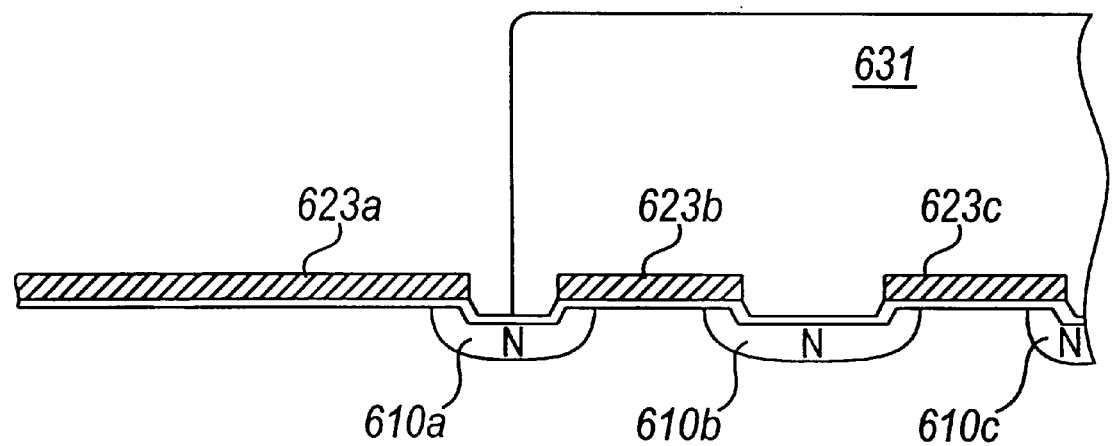

(b) Alternatively, OATs can also be provided without etching into semiconductor substrate 610. In this alternative process, at the steps illustrated in FIG. 6b, instead of etching oxide layer 611 and semiconductor substrate 610 after selectively removing portions of nitride layer 623 exposed by photoresist layer 630, photoresist layer 630 is removed. Thereafter, as shown in FIG. 6g, LOCOS field oxide layer 615 is provided. LOCOS field oxide 615 should have a thickness at least twice the required OAT step height requirement. A controlled etching step can then be applied to reduce LOCOS field oxide 615 to about 500 Å thick (FIG. 6h). (Of course, LOCOS field oxide 615 can also be made to a desirable thickness, e.g. 200–500 Å, by completely removing LOCOS field oxide 615, followed by a controlled oxide growth step). Thereafter, photoresist 631 is provided to protect not only N-well regions, but also the OAT regions. Subsequent process steps in this alternative process are the same as those described above, with respect to FIGS. 6c–6f.

(c) Yet another alternative process for creating OATs is achieved by combining the steps of the processes discussed in (a) and (b). Under this second alternative process, a predetermined depth of the substrate is removed from substrate regions 610b and 610c, as discussed in (a) above, and LOCOS field oxide layer 615 is grown, in accordance with the steps discussed in (b) above, to a depth optimized for a given OAT step height.

Note that the protection of exposed semiconductor regions 610a, 610b, 610c and 610d with oxide regions 612a, 612b and 612c is optional.

While several embodiments of this invention have been described, these descriptions are not intended to be limiting and, based on this disclosure, other embodiments within the scope of the present invention will be obvious to those skilled in the art. For example, while this invention has been described using optimized wells intended for the fabrication of transistors, the principles of this invention apply equally well to the use of optimized wells for any other semiconductor devices.

We claim:

1. A method of fabricating a first well of a first conductivity type and a second well of a second conductivity type on a semiconductor substrate, said second conductivity type opposite to the first conductivity type, the method comprising the steps of:

providing a first mask to define said semiconductor substrate a first field region;

introducing into said first field region impurities of said first conductivity;

providing a second mask to define in said semiconductor substrate a second field region;

introducing into said second field region impurities of said second conductivity;

forming a layer of oxide over said first and second field regions of said first and second wells;

using said layer of oxide as a mask, introducing impurities of said first conductivity type into said semiconductor substrate;

providing a third mask over selected portions of said semiconductor substrate and said first field region; and introducing into said semiconductor substrate impurities of said second conductivity type.

2. The method for fabricating said first and second wells of claim 1 wherein said first, second and third masks comprise a photoresist material.

3. The method for fabricating said first and second wells of claim 1 wherein said step of providing a first mask also defines in said semiconductor substrate a region for forming an alignment target.

4. The method of claim 3, further comprising, after defining in said semiconductor substrate said region for forming an alignment target, etching said region for an alignment target.

5. The method of claim 3, further comprising, after defining in said semiconductor substrate said region for forming an alignment target, growing an oxide layer in said region for an alignment target.

6. The method of claim 5, further comprising the step of reducing the thickness of said oxide layer.

7. The method of claim 1, further comprising, after introducing said impurities of said first and second conductivity types into said first and second field regions, providing a protective layer above said first and second field regions.

8. The method of claim 7, wherein said protective layer comprises an oxide layer.

* * * * *